US009698096B2

(12) United States Patent
Hirano et al.

(10) Patent No.: US 9,698,096 B2
(45) Date of Patent: Jul. 4, 2017

(54) SEMICONDUCTOR DEVICE

(71) Applicant: Panasonic Intellectual Property Management Co., Ltd., Osaka (JP)

(72) Inventors: Hiroshige Hirano, Toyama (JP); Kazuhiro Kaibara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/854,071

(22) Filed: Sep. 15, 2015

(65) Prior Publication Data

US 2016/0005688 A1    Jan. 7, 2016

Related U.S. Application Data

(63) Continuation of application No. PCT/JP2013/005896, filed on Oct. 3, 2013.

(30) Foreign Application Priority Data

Mar. 22, 2013 (JP) ................... 2013-060538

(51) Int. Cl.
*H01L 23/00* (2006.01)
*H01L 23/522* (2006.01)
(Continued)

(52) U.S. Cl.
CPC .......... *H01L 23/5226* (2013.01); *H01L 21/48* (2013.01); *H01L 23/5329* (2013.01);
(Continued)

(58) Field of Classification Search
CPC . H01L 23/5226; H01L 23/5329; H01L 24/03; H01L 24/05; H01L 23/53228
See application file for complete search history.

(56) References Cited

U.S. PATENT DOCUMENTS 5,773,899 A    6/1998  Zambrano
6,215,130 B1 *  4/2001  Dodabalapur ........ H01L 21/743
                                                        257/347
(Continued)

FOREIGN PATENT DOCUMENTS

JP    64-039035    2/1989
JP    5-343466    12/1993
(Continued)

OTHER PUBLICATIONS

International Search Report of PCT application No. PCT/JP2013/005896 dated Jan. 14, 2014.

*Primary Examiner* — Christine Enad
(74) *Attorney, Agent, or Firm* — McDermott Will & Emery LLP

(57) ABSTRACT

A semiconductor device of the disclosure comprises: a first wiring disposed on a semiconductor substrate; a first insulating film disposed on the first wiring; a first via disposed in the first insulating film so as to be connected to the first wiring; a second wiring disposed on the first insulating film so as to be connected to the first wiring through the first via; a first organic insulating film disposed on the second wiring; a second via disposed in the first organic insulating film so as to be connected to the second wiring; a third wiring disposed on the first organic insulating film so as to be connected to the second wiring through the second via; and a second organic insulating film disposed on the first organic insulating film. A pad opening portion through which the third wiring is exposed is provided in the second organic insulating film, and the first via, the second via, the second wiring, and the third wiring are made of metal whose main component is copper.

18 Claims, 14 Drawing Sheets

(51) Int. Cl.
*H01L 23/532* (2006.01)
*H01L 21/48* (2006.01)

(52) U.S. Cl.
CPC .............. *H01L 24/03* (2013.01); *H01L 24/05* (2013.01); *H01L 23/53238* (2013.01); *H01L 24/45* (2013.01); *H01L 2224/02166* (2013.01); *H01L 2224/02372* (2013.01); *H01L 2224/03* (2013.01); *H01L 2224/04042* (2013.01); *H01L 2224/05093* (2013.01); *H01L 2224/05556* (2013.01); *H01L 2224/05557* (2013.01); *H01L 2224/05558* (2013.01); *H01L 2224/05647* (2013.01); *H01L 2224/05655* (2013.01); *H01L 2224/45014* (2013.01); *H01L 2224/45015* (2013.01); *H01L 2224/45124* (2013.01); *H01L 2224/4847* (2013.01); *H01L 2224/48747* (2013.01); *H01L 2224/48755* (2013.01); *H01L 2224/49107* (2013.01)

(56) References Cited

U.S. PATENT DOCUMENTS

| | | |
|---|---|---|
| 6,313,540 B1 | 11/2001 | Kida et al. |
| 2002/0005583 A1* | 1/2002 | Harada ................... H01L 24/03 257/758 |
| 2004/0113238 A1* | 6/2004 | Hasunuma ........ H01L 21/76832 257/636 |
| 2005/0054188 A1 | 3/2005 | Matsuura et al. |
| 2005/0146041 A1 | 7/2005 | Watanabe et al. |
| 2005/0255650 A1 | 11/2005 | Hasunuma et al. |
| 2006/0040491 A1* | 2/2006 | Lim ................... H01L 21/76802 438/637 |
| 2007/0048931 A1* | 3/2007 | Shimizu ............ H01L 21/28556 438/243 |
| 2007/0108618 A1 | 5/2007 | Hasunuma et al. |
| 2007/0145583 A1 | 6/2007 | Matsuura et al. |
| 2009/0206490 A1 | 8/2009 | Koide et al. |
| 2009/0294988 A1 | 12/2009 | Watanabe et al. |
| 2010/0090344 A1* | 4/2010 | Ota ......................... H01L 24/05 257/762 |
| 2010/0130004 A1 | 5/2010 | Watanabe et al. |
| 2011/0001236 A1 | 1/2011 | Koide et al. |
| 2011/0147922 A1* | 6/2011 | Bezama ............ H01L 21/76804 257/737 |
| 2011/0175232 A1* | 7/2011 | Ota ......................... H01L 24/05 257/774 |
| 2012/0025394 A1* | 2/2012 | Hirano .............. H01L 21/76807 257/774 |
| 2012/0235278 A1 | 9/2012 | Shigihara et al. |
| 2013/0001772 A1 | 1/2013 | Koide et al. |
| 2013/0233607 A1* | 9/2013 | Nakamura ........... H05K 1/0206 174/262 |

FOREIGN PATENT DOCUMENTS

| | | |
|---|---|---|
| JP | 2000-195896 | 7/2000 |
| JP | 2001-267323 | 9/2001 |
| JP | 2004-095916 | 3/2004 |
| JP | 2004-119969 | 4/2004 |
| JP | 2004-140093 | 5/2004 |
| JP | 2005-085939 | 3/2005 |
| JP | 2006-095916 | 4/2006 |
| JP | 2009-188228 | 8/2009 |
| JP | 2009-194144 | 8/2009 |
| JP | 2010-278053 | 12/2010 |
| JP | 2012-191123 | 10/2012 |

* cited by examiner

SEMICONDUCTOR DEVICE

RELATED APPLICATIONS

This application is a Continuation of International Application No. PCT/JP2013/005896, filed on Oct. 3, 2013, which in turn claims priority from Japanese Patent Application No. 2013-060538, filed on Mar. 22, 2013, the contents of all of which are incorporated herein by reference in their entireties.

TECHNICAL FIELD

The present disclosure relates to a semiconductor device, and more particularly, to a semiconductor device provided with a pad.

BACKGROUND ART

There is a limit on the miniaturization of a plane area of the electrode pad for semiconductor devices, especially for a power device which requires a large current, because a diameter of a wire or a size of a ribbon to be connected to the electrode pad is preferably large in order to apply a large current. Accordingly, a so-called pad-on-element structure where an electrode pad is formed on an element is being considered (for example, see U.S. Pat. No. 5,773,899). Also, a structure that an electrode pad is connected to an under wire by using a plurality of vias, which does not provide the electrode pad over the element, is being considered for preventing a pad from cracking (for example, see Unexamined Japanese Patent Publication No. 2000-195896).

U.S. Pat. No. 5,773,899, which is a first conventional example, describes a structure as shown in FIG. 23 where first wire 18 is wire-bonded on an element. Regions of two wiring layers 12 and 16 where first wire 18 is connected configure a pad structure which is connected with almost the whole of wiring layers 12 and 16. This pad structure does not include an insulating film between two wiring layers 12 and 16, and thus adhesivity between wiring layers 12 and 16 is desirable. On the other hand, with respect to second wire 17, insulating film 13 is provided on almost an entire region between two wiring layers 12 and 16, and stress is relaxed by insulating film 13.

Also, Unexamined Japanese Patent Publication No. 2000-195896, which is a second conventional example, describes a structure as shown in FIG. 24 where, as a pad structure formed on substrate 51, wiring 54 is connected to pad 52 formed on wiring 54 by a plurality of vias 53. The strength of pad 52 is increased by being supported by a plurality of vias 53. This is a structure where a flattening process or the like is performed after a plurality of vias 53 are embedded in insulating film 55, and insulating film 55 is supposed to be an inorganic insulating film.

SUMMARY

An aspect of a semiconductor device according to the present disclosure includes a first wiring disposed on a semiconductor substrate; a first insulating film disposed on the first wiring; a first via disposed in the first insulating film so as to be connected to the first wiring; a second wiring disposed on the first insulating film so as to be connected to the first wiring through the first via; a first organic insulating film disposed on the second wiring; a second via disposed in the first organic insulating film so as to be connected to the second wiring; a third wiring disposed on the first organic insulating film so as to be connected to the second wiring through the second via; and a second organic insulating film disposed on the first organic insulating film. A pad opening portion through which the third wiring is exposed is provided in the second organic insulating film, and the first via, the second via, the second wiring, and the third wiring are made of metal whose main component is copper.

According to an aspect of the present disclosure, the second wiring is disposed on the first wiring through the first via, and the third wiring is disposed on the first organic insulating film through the second via. Accordingly, stress that is applied at wire-bonding to the third wiring, which is exposed through the pad opening portion, may be reliably relaxed, and thus a highly reliable semiconductor device may be obtained.

According to an aspect of the present disclosure, a seed layer may be disposed at a boundary portion between the second wiring and the first insulating film, and at a boundary portion between the third wiring and the first organic insulating film.

This allows that the first via, the second via, the second wiring, and the third wiring, which are made of metal whose main component is copper, are easily formed.

In this case, the seed layer does not have to be disposed at either a connection portion between the first via and the second wiring, or a connection portion between the second via and the third wiring.

This allows that the first via is embedded at the same time as the second wiring is formed, and the second via is embedded at the same time as the third wiring is formed, and thus the productivity may be increased.

According to an aspect of the present disclosure, a barrier film may be disposed on at least one of the second wiring and the third wiring.

According to an aspect of the present disclosure, a recess of an upper surface of the third wiring may be provided over the second via.

Accordingly, tensile stress and stress that is applied at the time of wire-bonding are not easily applied to the regions where the recesses are formed, and thus it is possible to both prevent cracking and increase adhesion.

According to an aspect of the present disclosure, the first wiring may include a plurality of line-shaped wirings which are arranged in parallel with each other, and may be disposed under the pad opening portion, and the first via may include a plurality of line-shaped line vias which are arranged along and on the first wiring in plan view.

This enables to both prevent cracking and increase adhesion.

In this case, the line vias may be arranged on every other line-shaped wirings of the first wiring in plan view.

This may further relax the stress of wire-bonding.

Also, in this case, the second via may include a line-shaped line via.

This increases the adhesion between the second wiring and the third wiring.

In this case, the first via and the second via may be arranged in parallel with each other in plan view.

This may achieve a structure which is capable of both preventing cracking and increasing the adhesion. Also, the reliability of wire-bonding is increased if the extending direction of the second via and the direction of application of ultrasonic wave power that is applied at the time of wire-bonding.

Also, in this case, the first via and the second via may be arranged so as to overlap each other in plan view.

This also may achieve a structure which is capable of both preventing cracking and increasing the adhesion. Also, the reliability of wire-bonding is increased if the extending direction of the second via and the direction of application of ultrasonic wave power that is applied at wire-bonding.

When the first via includes line vias arranged along and on the first wiring in plan view, the second via may include a dot via that is disposed in an island manner.

This increases the adhesion between the second wiring and the third wiring. Moreover, the stress of wire-bonding is relaxed by the first organic insulating film at regions other than the dot via.

In this case, the second via may be disposed so as to overlap the first via in plan view.

This may suppress occurrence of cracks.

In this case, the second via may include a plurality of dot vias which are arranged at an interval over the first via, and another plurality of dot vias which are arranged at an interval in a direction intersecting an extending direction of the first via.

Moreover, in this case, the plurality of dot vias of the second via may be arranged at positions other than intersection points of first virtual lines and second virtual lines. The first virtual lines are passing through the first wiring where the first via is not disposed. The second virtual lines are intersecting with the first virtual lines and passing through the dot vias of second via disposed on the first wiring where the first via is disposed.

This may further relax the stress of wire-bonding.

According to an aspect of the present disclosure, the first wiring may include a plurality of line-shaped wirings which are arranged in parallel with each other, and is disposed under the pad opening portion, the first via and the second via may include a plurality of dot vias disposed on the first wiring in an island manner so as not to overlap each other in plan view, the dot vias of the first via may be arranged on every other line-shaped wirings of the first wiring, and the dot vias of the second via may be arranged at positions other than intersection points of first virtual lines and second virtual lines. The first virtual lines are passing through the first wiring where the first via is not disposed, and second virtual lines are intersecting with the first virtual lines and passing through the dot vias of the second via disposed on the first wiring where the first via is disposed.

This may achieve a structure which is capable of both preventing cracking and increasing the adhesion.

This may also further relax the stress of wire-bonding.

According to an aspect of the present disclosure, the first wiring may include a plurality of line-shaped wirings which are arranged in parallel with each other, and is disposed under the pad opening portion. The second wiring may include a plurality of line-shaped wirings which are arranged along a direction intersecting with an extending direction of the first wiring in plan view. The first via may include a plurality of dot vias disposed in an island manner, and disposed at a region where the first wiring and the second wiring overlap each other in plan view.

This may also achieve a structure which is capable of both preventing cracking and increasing the adhesion.

In this case, the second via may be include a dot via disposed in an island manner, and disposed in a region where the first wiring and the second wiring overlap each other in plan view and where the first via is not disposed.

This may further relax the stress at the time of wire-bonding.

According to an aspect of the present disclosure, a semiconductor element may be disposed on the semiconductor substrate, and the pad opening portion of the second organic insulating film may be provided over the semiconductor element.

According to the semiconductor device of the present disclosure, it is possible to realize a highly reliable semiconductor device according to which film peeling or cracking of an interlayer insulating film or the like at the time of wire-bonding.

DESCRIPTION OF EMBODIMENTS

With respect to the semiconductor device described in U.S. Pat. No. 5,773,899, a pad structure including two wiring layers to which a first wire is bonded has a problem that, although the adhesivity between the wiring layers is desirable, the stress at the time of bonding tends to be applied to the element and the element is easily cracked, for example. Moreover, in the case of two wiring layers to which a second wire is bonded, the stress is relaxed by the structure where an insulating film is disposed between the two layers, but when the second wire is pulled, the upper wiring layer of the pad are separated from the insulating film below, and thus there is a problem of poor adhesion.

Moreover, with respect to the semiconductor device described in Unexamined Japanese Patent Publication No. 2000-195896, an insulating film where a plurality of vias are embedded is assumed to be an inorganic insulating film, and there is a problem that the inorganic insulating film may easily crack when a great force is applied at the time of wire-bonding, for example.

The present disclosure provides a highly reliable semiconductor device according to which film peeling or cracking of an interlayer insulating film or the like at the time of wire-bonding.

First Exemplary Embodiment

A semiconductor device according to a first exemplary embodiment is described with reference to FIGS. 1 and 2.

Figure 1:
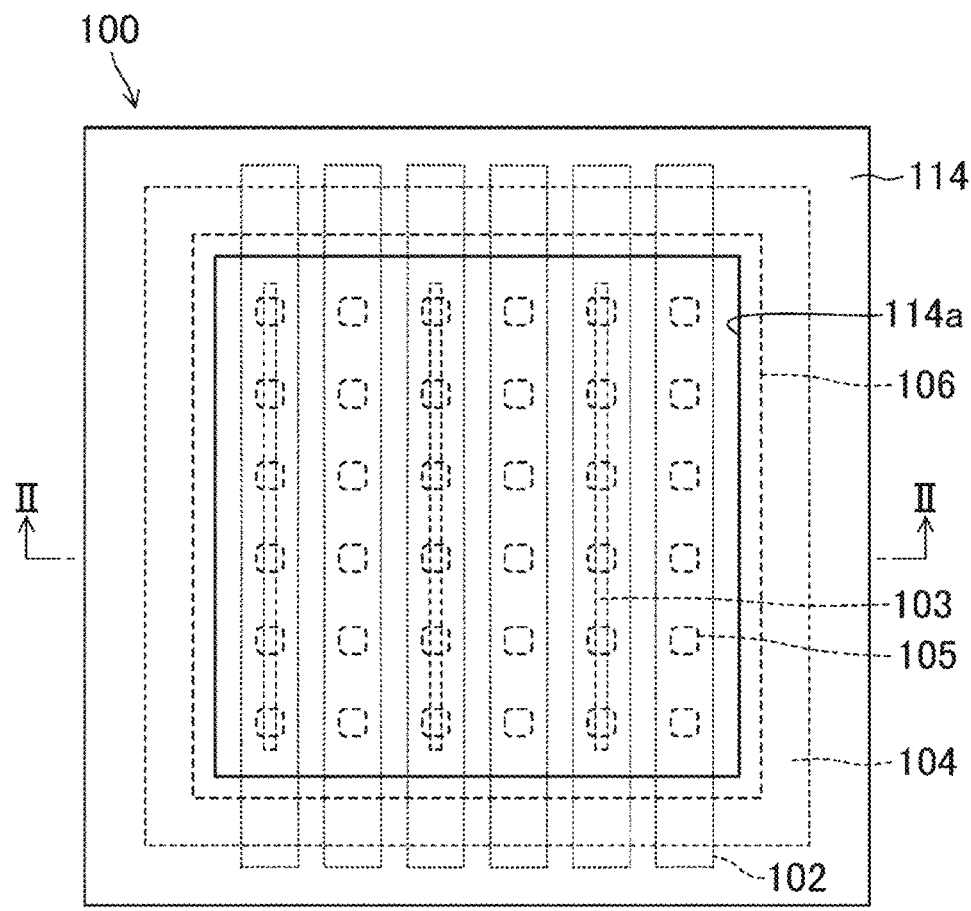
FIG. 1 is a plan view showing a pad structure which is a main portion of a semiconductor device according to a first exemplary embodiment.
Figure 2:
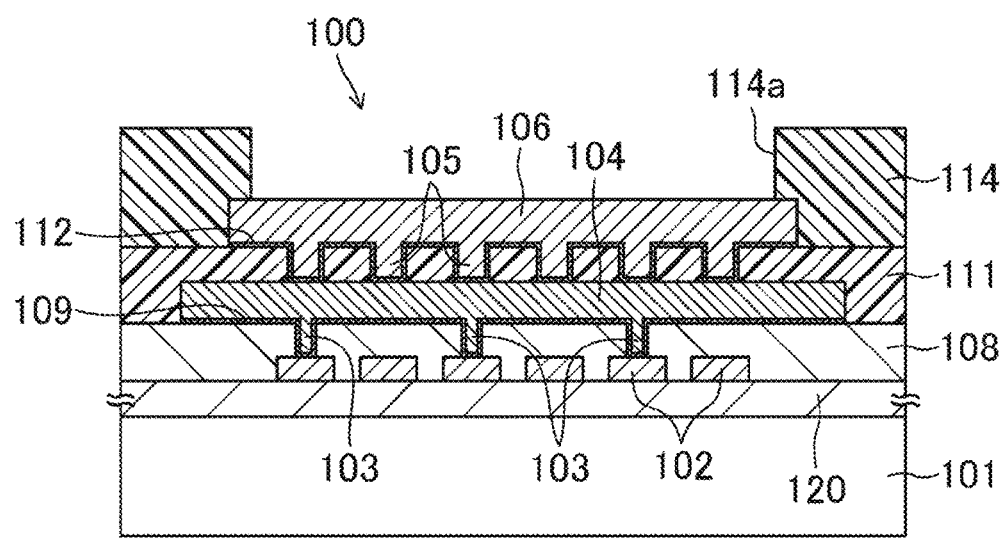
FIG. 2 is a cross-sectional view along line II-II in FIG. 1.

FIGS. 1 and 2 show pad structure 100 which is a main portion of the present semiconductor device. As shown in FIGS. 1 and 2, pad structure 100 according to the present exemplary embodiment includes interlayer insulating film 120 made of an inorganic material such as silicon dioxide ($SiO_2$) that is formed on semiconductor substrate 101 of silicon (Si). For example, a plurality of line-shaped wirings of first wiring 102 are selectively formed on interlayer insulating film 120. And first insulating film 108 of an inorganic material is formed on interlayer insulating film 120 so as to cover the plurality of line-shaped wirings of first wiring 102. Plate-shaped (film-shaped) second wiring 104 is formed over the plurality of line-shaped wirings of first wiring 102 and is connected to the plurality of line-shaped wirings of first wiring 102 through a plurality of line-shaped line vias of first via 103, and second wiring is made of copper (Cu) or a metal whose main component is copper. Plate-shaped (film-shaped) third wiring 106 is formed on second wiring 104 and is connected to second wiring 104 through a plurality of dot vias of second via 105, and third wiring is made of copper (Cu) or a metal whose main component is copper.

Additionally, although not shown, a semiconductor element such as a transistor (not shown) is provided on semiconductor substrate 101, at a desired arrangement region. The semiconductor element may be disposed at a region under pad structure 100.

Also, in the present specification, that a first structural member is disposed or formed on a second structural member may mean that the first structural member is disposed or formed in direct contact on the second structural member, or that the first structural member is disposed or formed on the second structural member through a third structural member, for example.

Second wiring 104 is disposed on first insulating film 108, and is covered at the periphery and at the upper surface by second insulating film 111 made of an organic material.

The plurality of line-shaped line vias of first via 103 are selectively disposed in an upper portion of first insulating film 108, and are formed by a metal constituting second wiring 104 being embedded in a plurality of holes (grooves) through which first wiring 102 is exposed.

Also, first seed layer 109 for embedding copper or a metal whose main component is copper is selectively formed at a boundary portion to first insulating film 108, where second wiring 104 and first via 103 are to be formed, so that second wiring 104 and first via 103 may be successively formed.

Third wiring 106 is disposed on second insulating film 111, and the periphery and a circumferential edge of an upper surface of third wiring 106 are covered by third insulating film 114 made of an organic material. Third wiring 106 is the actual pad electrode, and is exposed through pad opening portion 114a formed in third insulating film 114.

A plurality of dot vias of second via 105 are selectively disposed in an upper portion of second insulating film 111, and are formed by a metal constituting third wiring 106 being embedded in a plurality of holes through which second wiring 104 is exposed.

Also, second seed layer 112 for embedding copper or a metal whose main component is copper is formed at a boundary portion to second insulating film 111, where third wiring 106 and second via 105 are to be formed, so that third wiring 106 and second via 105 may be successively formed.

As shown in FIG. 1, in the present exemplary embodiment, the plurality of line-shaped wirings of first wiring 102 are arranged in parallel with each other at an interval. Also, the plurality of line-shaped line vias of first via 103 are arranged along a direction of extension of first wiring 102 (hereinafter referred to as "extending direction"), on every other line-shaped wirings of first wiring 102. Furthermore, the plurality of dot vias of second via 105 are arranged in an island manner over the plurality of line-shaped wirings of first wiring 102, so as to overlap first wiring 102 in plan view. Moreover, the plurality of dot vias of second via 105 are arranged at regular intervals over the plurality of line-shaped wirings of first wiring 102 in both the extending direction of first wiring 102 and a direction perpendicular to the extending direction. That is, as shown in FIG. 1, the plurality of dot vias of second via 105 are arranged in a mesh or grid, for example, and at every intersection point.

The organic material constituting second insulating film 111 and third insulating film 114 may be polybenzoxazole (PBO), for example.

First seed layer 109 for forming second wiring 104 and first via 103 in one step has a stacked structure of titanium (Ti) and copper (Cu). Additionally, since a formation method equivalent to dual damascene is used, first seed layer 109 is not formed at connection portions between second wiring 104 and first via 103. Also, first seed layer 109 is not formed at a side surface of second wiring 104.

In the same manner, second seed layer 112 for forming third wiring 106 and second via 105 in one step has a stacked structure of titanium and copper. Additionally, also in this case, second seed layer 112 is not formed at connection portions between third wiring 106 and second via 105, and at a side surface of third wiring 106.

In the following, a manufacturing method of a semiconductor device described above, particularly pad structure 100 of the semiconductor device, is described with reference to FIGS. 3A to 3C, FIGS. 4A to 4C, and FIGS. 5A to 5C.

Figure 3A:
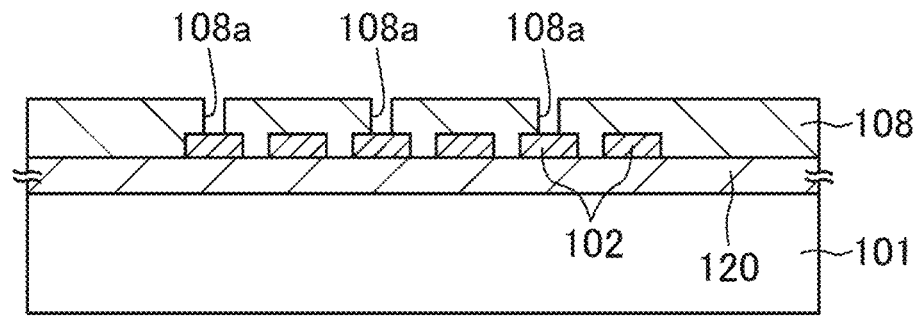
FIG. 3A is a cross-sectional view showing one step in the manufacturing method, according to the order of steps, of the semiconductor device according to the first exemplary embodiment.

First, although not shown, a semiconductor element is formed in an upper portion of semiconductor substrate 101 and on a predetermined region of semiconductor substrate 101. Then, as shown in FIG. 3A, interlayer insulating film 120 made of an inorganic material is formed on semiconductor substrate 101 by using a chemical vapor deposition (CVD) method, for example, so as to cover the semiconductor element. Then, a metal film is formed on interlayer insulating film 120, and patterning of the metal film is performed to form a plurality of line-shaped wirings of first wiring 102 that extend in parallel with each other. First wiring 102 is made of aluminum (Al) or the like by using sputtering, for example, and has a thickness of about 1 µm. Next, first insulating film 108 made of an inorganic material, for example, is formed on interlayer insulating film 120 so as to cover the plurality of line-shaped wirings of first wiring 102. Subsequently, a plurality of groove-shaped first via holes 108a through which every other line-shaped wirings of first wiring 102 is exposed are formed by lithography and etching at an upper portion of first insulating film 108. For example, a width of first via hole 108a is about 10 µm to 30 µm, and a length of first via hole 108a is about 100 µm to 400 µm.

Figure 3B:
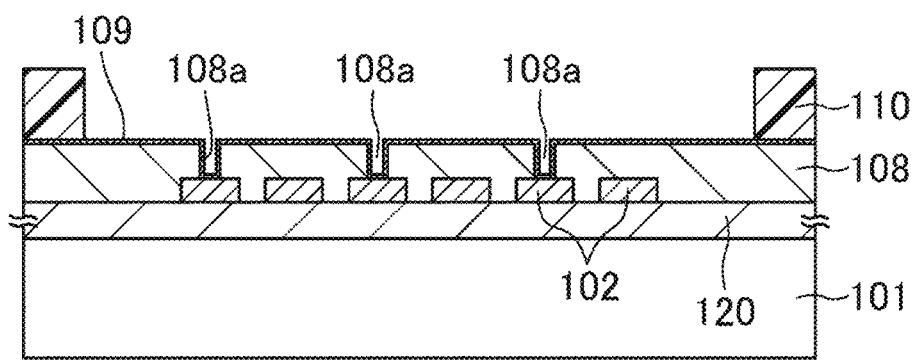
FIG. 3B is a cross-sectional view showing one step in the manufacturing method, according to the order of steps, of the semiconductor device according to the first exemplary embodiment.

Next, as shown in FIG. 3B, first seed layer 109 is formed by using sputtering, for example, on an entire upper surface of first insulating film 108 and on bottom surfaces and side surfaces of the plurality of first via holes 108a. First seed layer 109 is constituted from a titanium (Ti) film with a thickness of about 200 nm and a copper (Cu) film with a thickness of about 200 nm formed on the titanium film. Then, resist film 110 is formed on first insulating film 108 by lithography, resist film 110 having an opening in a region for forming copper plating.

Figure 3C:
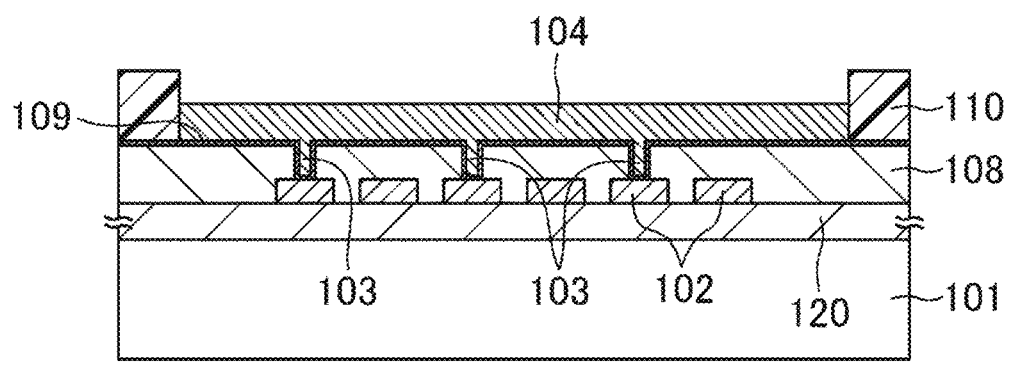
FIG. 3C is a cross-sectional view showing one step in the manufacturing method, according to the order of steps, of the semiconductor device according to the first exemplary embodiment.

Next, as shown in FIG. 3C, copper (Cu) electroplating is performed by applying a predetermined electric field to first seed layer 109 in a state that resist film 110 is formed. Second wiring 104 made of Cu and first via 103 formed by embedding Cu in first via holes 108a of first insulating film 108 are thus formed by one step in the opening of resist film 110 on first insulating film 108. Additionally, after the copper electroplating, a barrier film or the like of nickel (Ni) plating may be formed on second wiring 104 as necessary in order to increase the barrier properties against diffusion of copper atoms, for example. Particularly, in the case of a high voltage device, to increase the reliability under high electric field, a structure where the barrier properties are increased with respect to copper atoms is desirable. Here, the copper plating film has a thickness of about 5 µm to 10 µm, and the nickel barrier film has a thickness of about 2 µm.

Figure 4A:
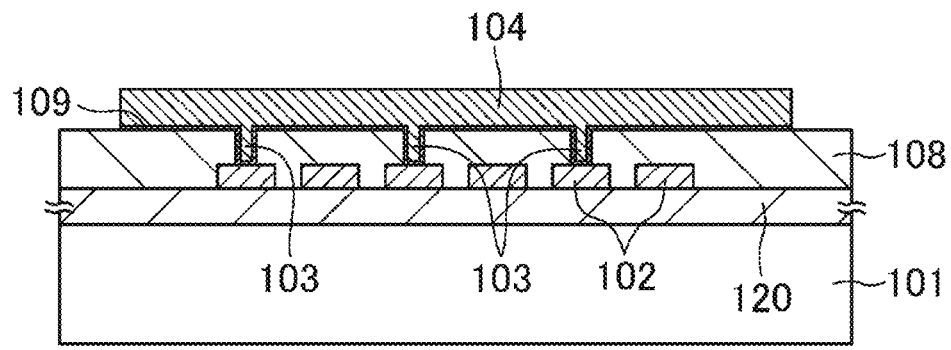
FIG. 4A is a cross-sectional view showing one step in the manufacturing method, according to the order of steps, of the semiconductor device according to the first exemplary embodiment.

Next, as shown in FIG. 4A, resist film 110 is removed, and then the Cu film and the Ti film constituting first seed layer 109 that is exposed from second wiring 104 on first insulating film 108 are removed by etching.

Figure 4B:
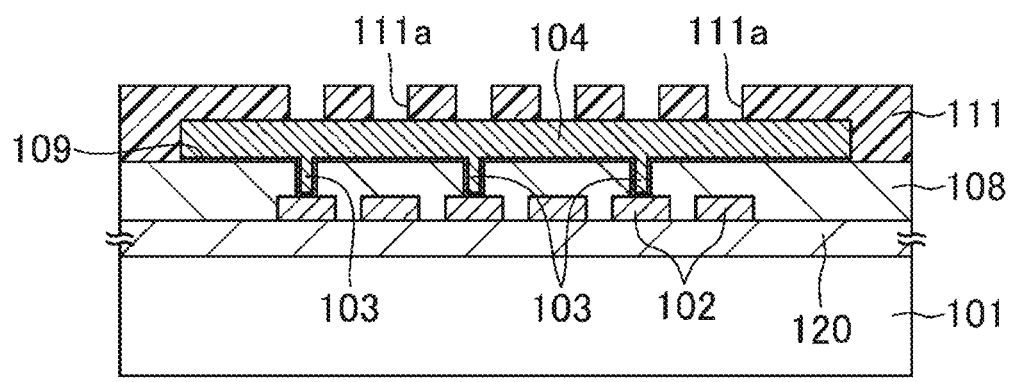
FIG. 4B is a cross-sectional view showing one step in the manufacturing method, according to the order of steps, of the semiconductor device according to the first exemplary embodiment.

Next, as shown in FIG. 4B, second insulating film 111 made of a material such as a photosensitive organic material is formed on first insulating film 108 by spin-coating, for example, so as to cover second wiring 104. Then, a plurality of second via holes 111a exposing second wiring 104 in dots are formed in an upper portion of second insulating film 111 by lithography. Here, the thickness of second insulating film 111 is about 10 µm.

Figure 4C:
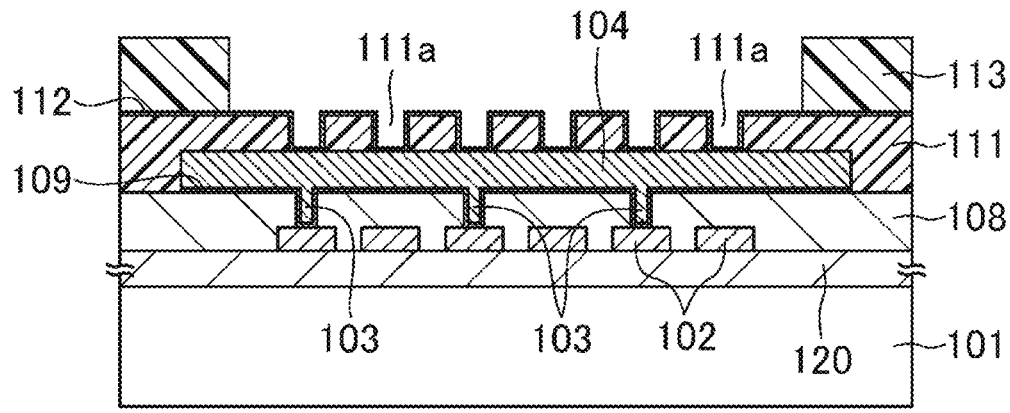
FIG. 4C is a cross-sectional view showing one step in the manufacturing method, according to the order of steps, of the semiconductor device according to the first exemplary embodiment.

Subsequently, as shown in FIG. 4C, second seed layer 112 is formed by using sputtering, for example, on an entire upper surface of second insulating film 111 and on bottom surfaces and side surfaces of the plurality of second via holes 111a. In the same manner as first seed layer 109, second seed layer 112 is constituted from a titanium film with a thickness of about 200 nm and a copper film with a thickness of about 200 nm formed on the titanium film. Then, resist film 113 is formed on second insulating film 111 by lithography, resist film 113 having an opening in a region for forming copper plating.

Figure 5A:
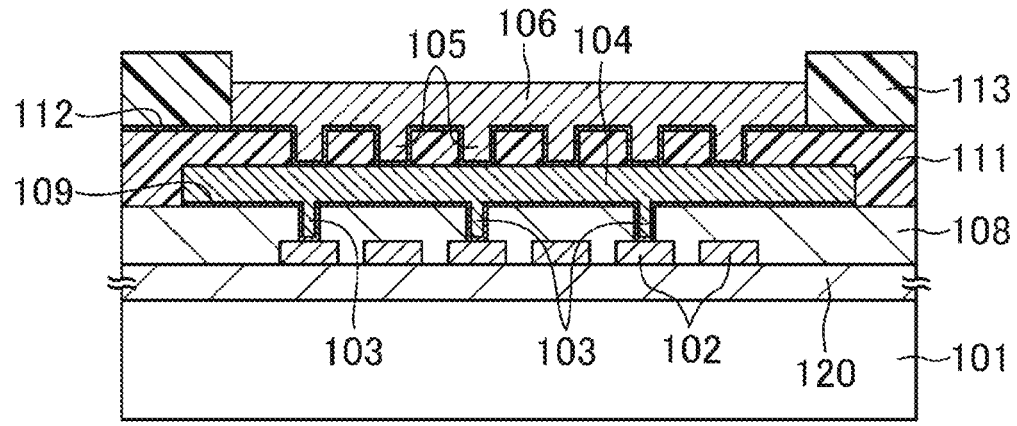
FIG. 5A is a cross-sectional view showing one step in the manufacturing method, according to the order of steps, of the semiconductor device according to the first exemplary embodiment.

Next, as shown in FIG. 5A, copper (Cu) electroplating is performed by applying a predetermined electric field to second seed layer 112 in a state that resist film 113 is formed. Third wiring 106 made of Cu and second via 105 formed by embedding Cu in second via holes 111a of second insulating film 111 are thus formed by one step in the opening of resist film 113 on second insulating film 111. Nickel plating on third wiring 106 is also performed at this time in view of long-term reliability of wire-bonding to pad structure 100.

Figure 5B:
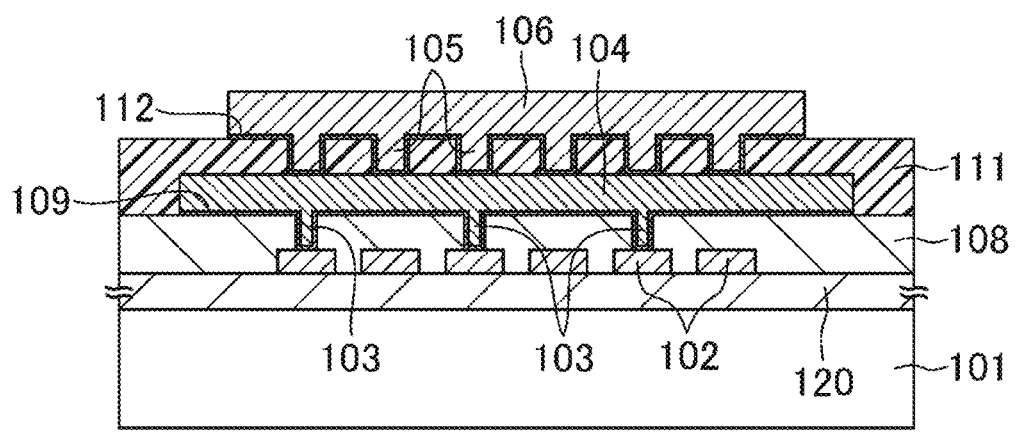
FIG. 5B is a cross-sectional view showing one step in the manufacturing method, according to the order of steps, of the semiconductor device according to the first exemplary embodiment.

Next, as shown in FIG. 5B, resist film 113 is removed, and then the Cu film and the Ti film constituting second seed layer 112 that is exposed from third wiring 106 on second insulating film 111 are removed by etching.

Figure 5C:
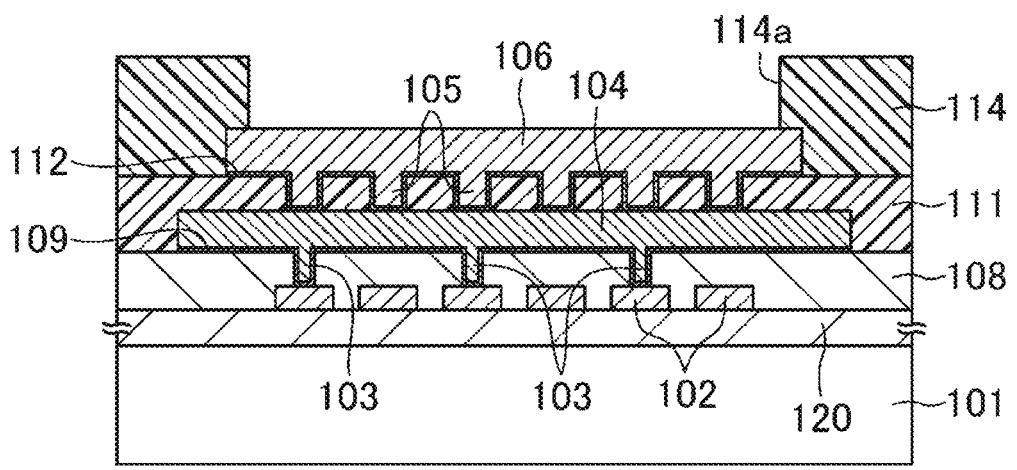
FIG. 5C is a cross-sectional view showing one step in the manufacturing method, according to the order of steps, of the semiconductor device according to the first exemplary embodiment.

Next, as shown in FIG. 5C, third insulating film 114 made of a material such as a photosensitive organic material is formed on second insulating film 111 by spin-coating, for example, so as to cover third wiring 106. Then, pad opening portion 114a exposing third wiring 106 is formed in third insulating film 114 by lithography.

As described above, in the first exemplary embodiment, a Ni film is formed on a surface of third wiring 106 that is a pad electrode. An aluminum (Al) wire, an Al ribbon or the like can be connected to a pad electrode whose surface is Ni by wire-bonding. In this case, Ni has barrier properties, reliability and good adhesion with respect to Al.

Furthermore, as shown in FIG. 1, with pad structure 100 according to the present exemplary embodiment, second wiring 104 made of Cu and third wiring 106 made of Cu are electrically and mechanically connected by the plurality of dot vias of second via 105 arranged in dots. Moreover, an insulating film made of an organic material is used as second insulating film 111, which is an interlayer film between second wiring 104 and third wiring 106. Since second wiring 104 and third wiring 106 are mechanically reliably connected due to the plurality of dot vias of second via 105 arranged in dots, third wiring 106 would not be peeled off from second wiring 104 even if tensile stress is applied to a wire after a wire-bonding step.

Moreover, regions between dot vias of second via 105 are filled with second insulating film 111 made of an organic material. Accordingly, second insulating film 111 made of an organic material filled in the regions where second via 105 is not disposed gives an effect of relaxing stress due to ultrasonic waves that are normally applied in the wire-bonding step. Thus, for example, in the case which a semiconductor element such as a transistor is disposed under pad structure 100, the semiconductor element or an insulating film made of an inorganic material may be prevented from cracking.

Now, the semiconductor device described in Unexamined Japanese Patent Publication No. 2000-195896 described above adopts a structure increasing the strength of the pad structure by embedding a plurality of vias with relatively high hardness. Thus, fracture of the pad structure is suppressed. On the other hand, pad structure 100 configuring the semiconductor device according to the present exemplary embodiment adopts a structure relaxing stress by an interlayer insulating film of an organic material. Thus, cracking or the like is suppressed or prevented.

Also, by using, as the plurality of dot vias of second via 105, copper (Cu) which allows so-called via filling plating that is embedding by third wiring 106 flattening the surface, the adhesivity at wire-bonding may be improved. Moreover, because the luster of the surface of third wiring 106 is enhanced, the connectivity between a wire to be connected and third wiring 106 is improved. In this manner, third wiring 106 may have the luster of its surface enhanced.

In the present exemplary embodiment, polybenzoxazole (PBO) is used as an insulating film of an organic material, but other than PBO, organic films of polyimide, benzocyclobutene (BCB), epoxy photosensitive resin (for example, SU-8 produced by Kayaku Microchem Corporation), and fluorine photosensitive resin (for example, AL-X2 produced by Asahi Glass Co., Ltd.) may also be used, for example. Also, as an insulating film made of an inorganic material, silicon nitride (SiN), silicon dioxide ($SiO_2$) or the like may be used.

Moreover, in the present exemplary embodiment, the potential of second wiring 104 is the same as that of third wiring 106, but this is not restrictive. A structure which the potentials of wirings are partially different with each other is also allowed.

Furthermore, in the present exemplary embodiment, a barrier film made of Ni is formed on the surfaces of both second wiring 104 and third wiring 106, but the barrier film may alternatively be formed on one of the surfaces.

First Modification of First Exemplary Embodiment

In the following, a first modification of the first exemplary embodiment is described with reference to FIGS. 6 and 7.

Figure 6:
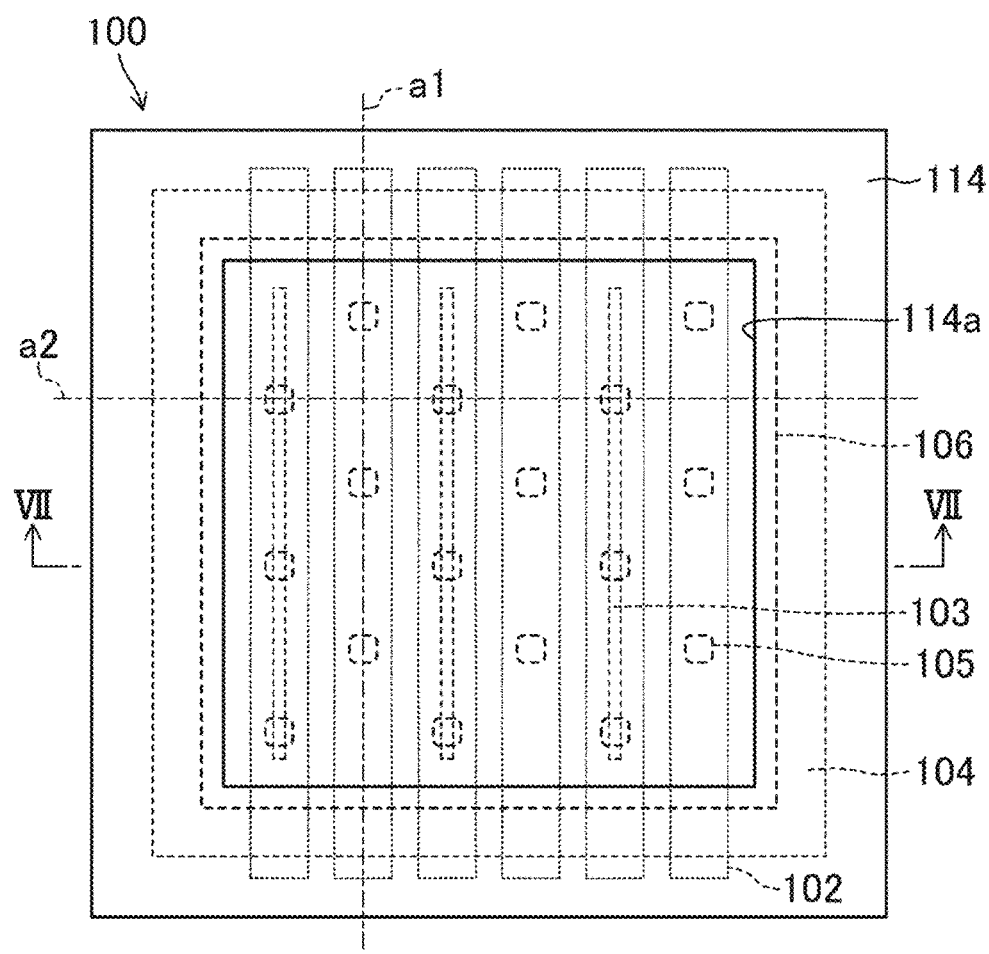
FIG. 6 is a plan view showing a pad structure which is a main portion of a semiconductor device according to a first modification of the first exemplary embodiment.
Figure 7:
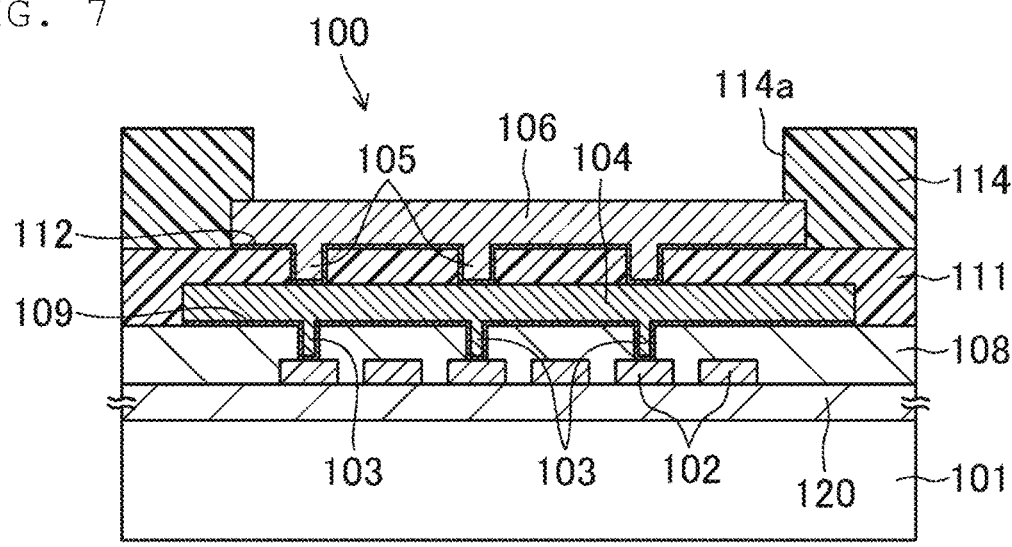
FIG. 7 is a cross-sectional view along line VII-VII in FIG. 6.

As shown in FIGS. 6 and 7, the present modification is different from the first exemplary embodiment in the arrangement and the number of dot vias of second via 105. In the present modification, a plurality of dot vias of second via 105 are arranged in a zigzag manner, which are disposed at intersection points of a mesh in the first exemplary embodiment, and the number of dot vias of second via 105 is reduced to about half, for example.

Specifically, a plurality of dot vias of second via 105 are disposed at positions other than the intersection points of first virtual lines a1 and second virtual lines a2. First virtual line a1 is passing through first wiring 102 where first via 103 is not disposed. And second virtual line a2 is intersecting with first virtual line a1 and passing through second via 105 on first wiring 102 where first via 103 is disposed.

In the present modification, the number of dot vias of second via 105 is reduced, and the percentage of an area for second insulating film 111 made of an organic material against an area of second via 105 is increased. Therefore, stress that is applied at wire-bonding may be relaxed, and cracking of the semiconductor element or first insulating film 108 made of an inorganic material may be prevented.

Moreover, as described in a third modification later, if embedding properties of second via 105 are somewhat poor, since the area of a flat portion of second insulating film 111 is increased by reducing the number of dot vias of second via 105, the adhesivity of wire-bonding may be improved.

Second Modification of First Exemplary Embodiment

In the following, a second modification of the first exemplary embodiment is described with reference to FIGS. 8 to 10.

Figure 8:
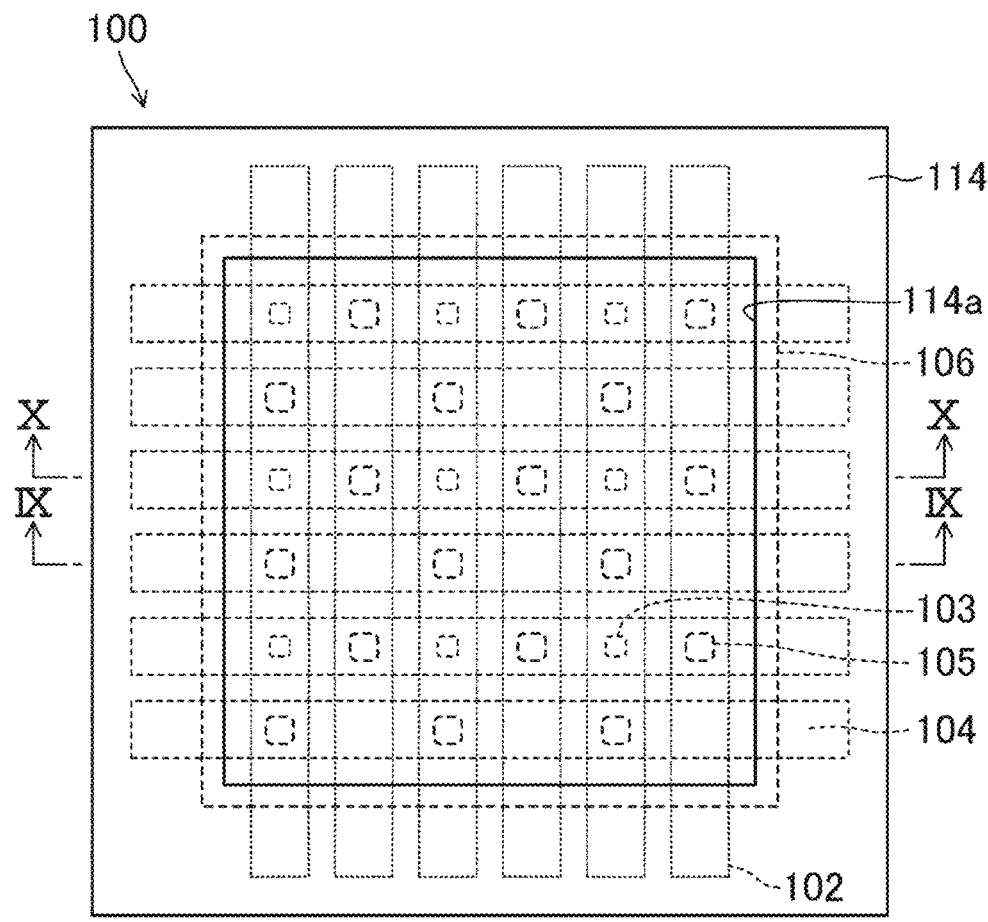
FIG. 8 is a plan view showing a pad structure which is a main portion of a semiconductor device according to a second modification of the first exemplary embodiment.
Figure 9:
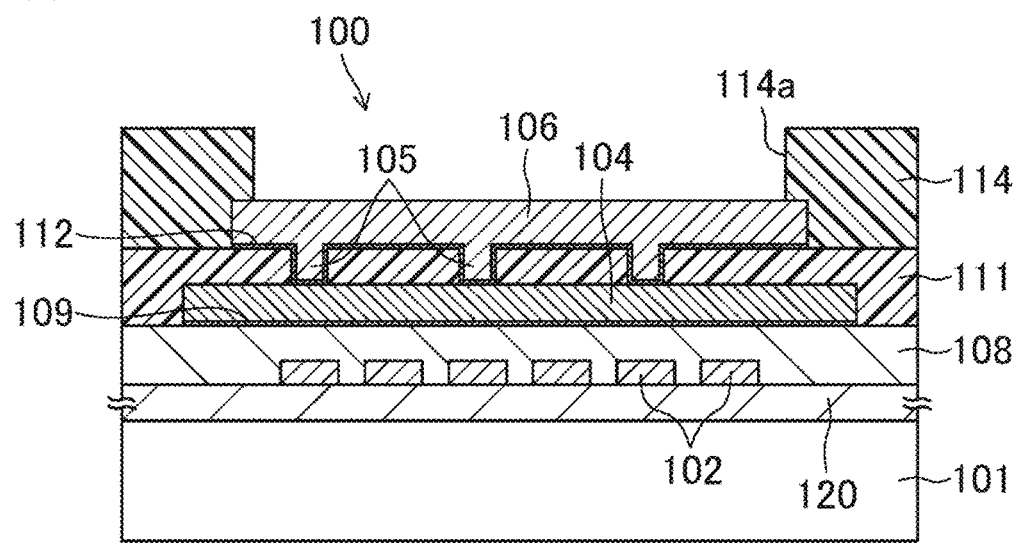
FIG. 9 is a cross-sectional view along line IX-IX in FIG. 8.
Figure 10:
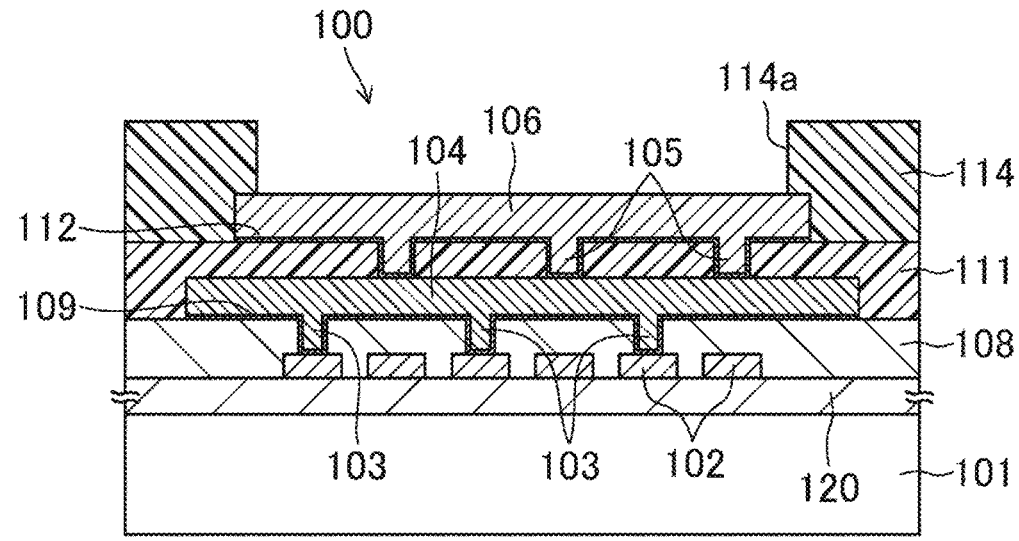
FIG. 10 is a cross-sectional view along line X-X in FIG. 8.

As shown in FIGS. 8 to 10, the present modification is different from the first modification in the shape of second wiring 104. In this modification, second wiring 104 is constituted from a plurality of line-shaped wirings intersecting with first wiring 102. And that first via 103 and second via 105 are arranged at different regions in plan view. Also, first via 103 and second via 105 are disposed in an island manner (in dots) at intersecting regions, in plan view, of first wiring 102 and second wiring 104.

More specifically, the plurality of dot vias of first via 103 are disposed at overlapping regions of first wiring 102 and second wiring 104. Also, dot vias of second via 105 are disposed at overlapping regions of first wiring 102 and second wiring 104 where first via 103 is not disposed. Here, dot vias of second via 105 are arranged in a zigzag manner as the same as the first modification.

According to the present modification, first via 103 and second via 105 are both in dots, and the arrangement positions of dot vias of first via 103 and second via 105 are shifted each other. This enables a structure that stress applied at wire-bonding does not directly affect first wiring 102 and a transistor element or the like under first wiring 102. That is to say, it is possible to achieve a structure that stress applied to first wiring 102, a transistor element and the like at wire-bonding may be relaxed. Accordingly, first wiring 102, a transistor element and the like are not directly pressed by third wiring 106 at wire-bonding, and great reduction of stress can be achieved by interposing second insulating film 111 made of an organic material between third wiring 106 and second wiring 104.

Third Modification of First Exemplary Embodiment

In the following, a third modification of the first exemplary embodiment is described with reference to FIGS. 11 to 13. Here, the vertical axis of the graph in FIG. 13 shows the relative strength.

Figure 11:
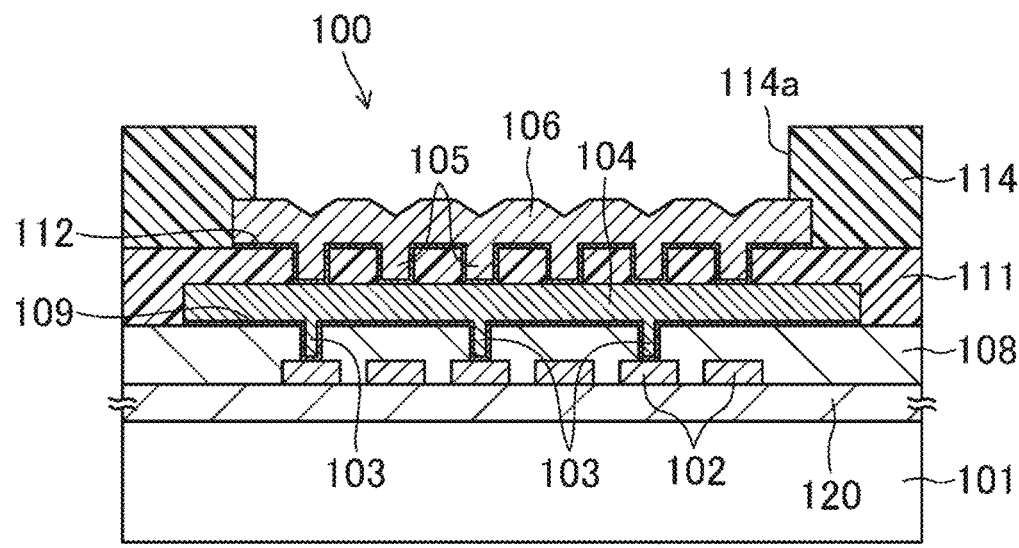
FIG. 11 is a cross-sectional view showing a pad structure which is a main portion of a semiconductor device according to a third modification of the first exemplary embodiment.
Figure 12:
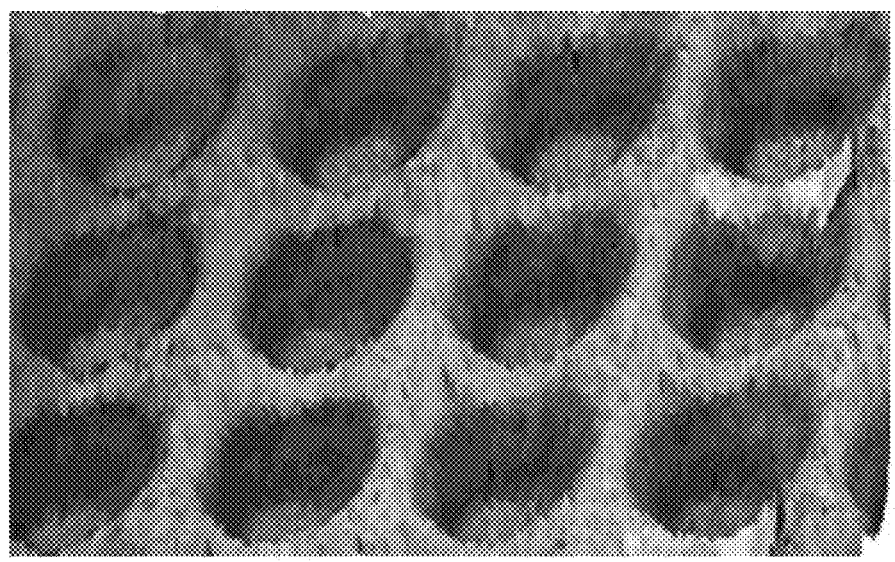
FIG. 12 is a three-dimensional view of a step measurement result by a laser step measurement equipment for a surface of the pad structure of the semiconductor device according to the third modification of the first exemplary embodiment.

As shown in FIGS. 11 and 12, the present modification is different from the first exemplary embodiment in the embedding state of dot vias of second via 105. In this modification, the embedding state of each of dot vias of second via 105 is somewhat poor, that is to say, incomplete. By making the embedding state of dot vias of second via 105 incomplete, recesses of a surface of third wiring 106, which is the actual pad electrode, are provided over dot vias of second via 105. Here, the plan view of pad structure 100 of the semiconductor device according to the present modification is the same as that in FIG. 1.

This may achieve a structure that the stress applied on third wiring 106 at wire-bonding is not directly transmitted to a portion under third wiring 106. That is to say, it is possible to achieve a structure that stress applied to first wiring 102, a transistor element and the like at wire-bonding may be relaxed. Accordingly, a structure may be achieved that, due to the effect of stress relaxation, cracking of a semiconductor element or first insulating film 108 of an inorganic material may be prevented.

Figure 13:
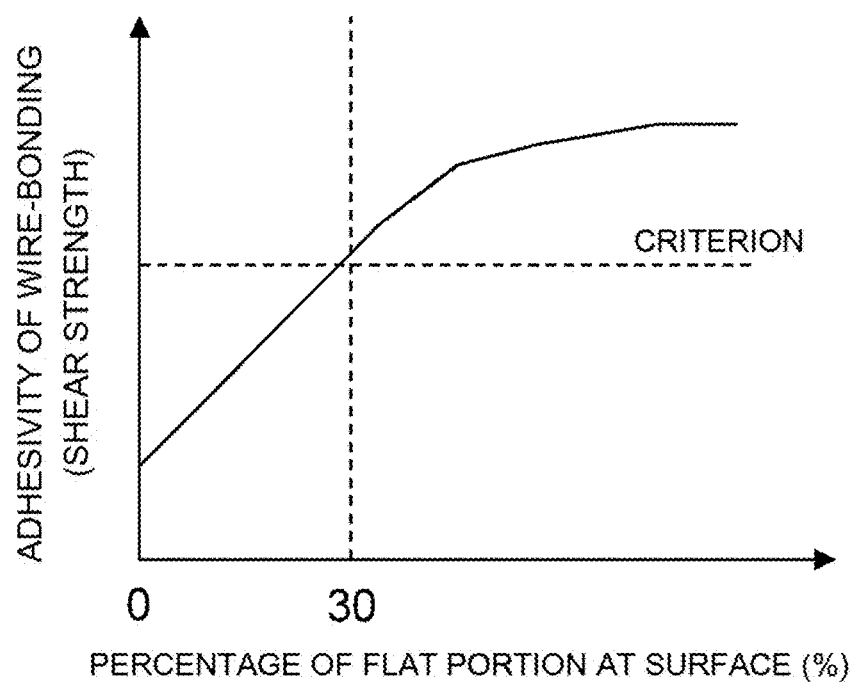
FIG. 13 is a graph showing a relationship between adhesivity of wire-bonding and a percentage of flat portion at the surface of the pad structure of the semiconductor device according to the third modification of the first exemplary embodiment.

However, as shown in FIG. 13, if a plurality of recesses are provided on the surface of third wiring 106, the percentage of flat portion at the surface of third wiring 106 is reduced, and thus the reliability of wire-bonding is reduced. Accordingly, the percentage of flat portion at the surface of third wiring 106 may be 30% or more by which a predetermined shear strength (criterion) may be obtained. Specifically, by reducing the number of dot vias of second via 105 in the manner of the first modification of the first exemplary embodiment, an effect of stress reduction at wire-bonding and a structure which further increases the reliability of wire-bonding may be achieved.

Second Exemplary Embodiment

In the following, a second exemplary embodiment is described with reference to FIGS. 14 and 15.

Figure 14:
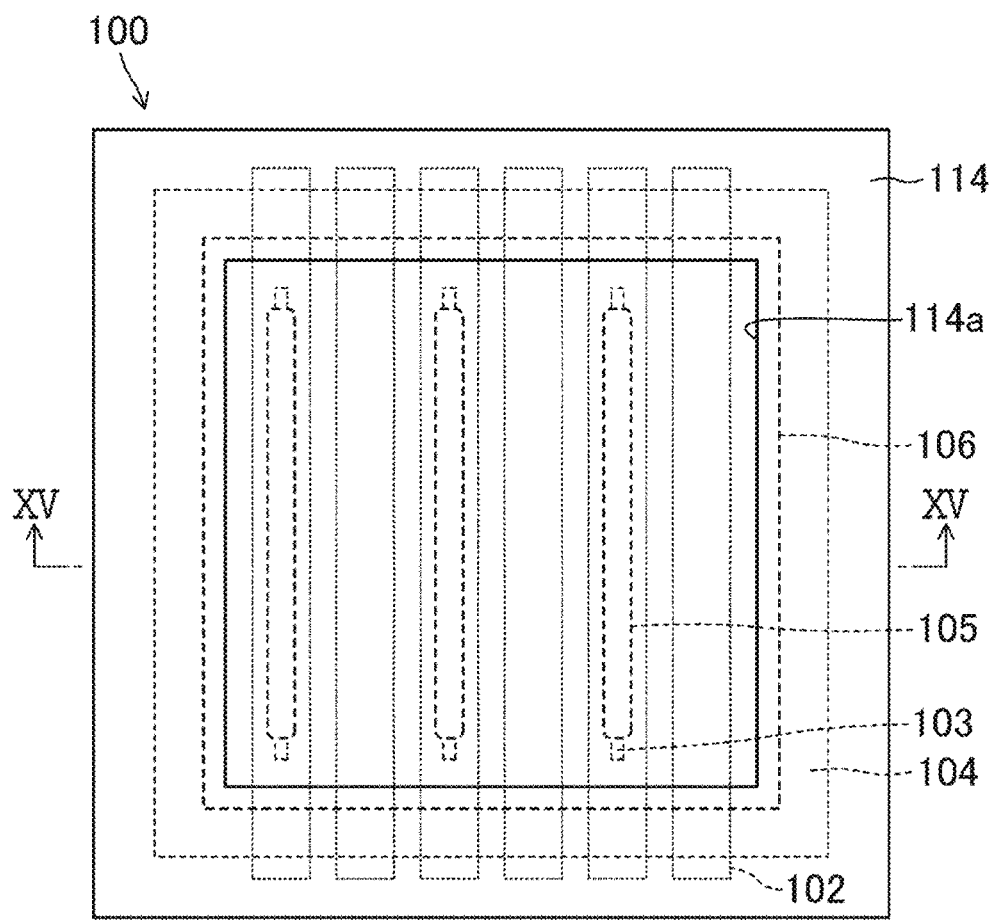
FIG. 14 is a plan view showing a pad structure which is a main portion of a semiconductor device according to a second exemplary embodiment.
Figure 15:
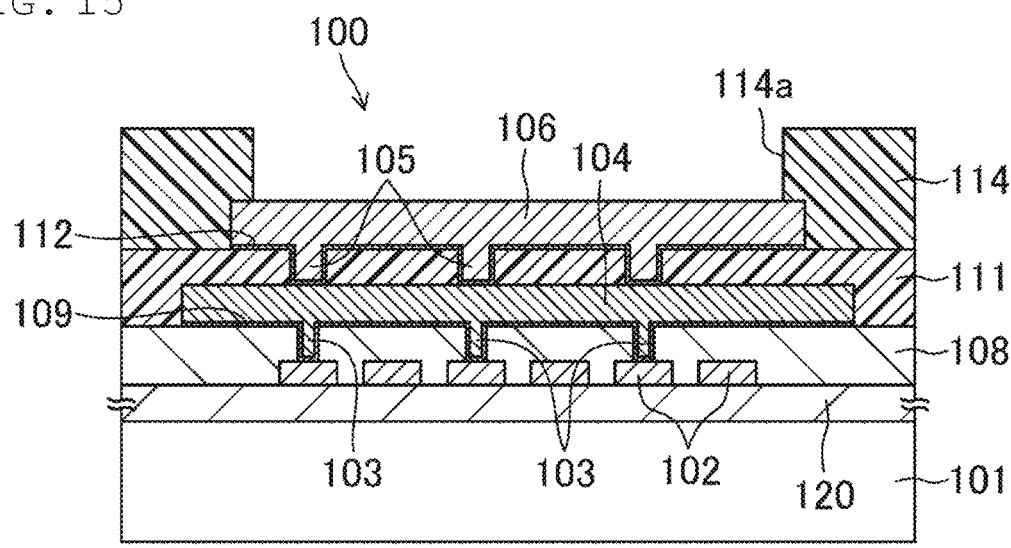
FIG. 15 is a cross-sectional view along line XV-XV in FIG. 14.

As shown in FIGS. 14 and 15, the present exemplary embodiment is different from the first exemplary embodiment in the shape of second via 105. In this exemplary embodiment, a plurality of line-shaped line vias of second via 105 are arranged along first wiring 102 that are formed as a plurality of line-shaped wirings extending in parallel with each other. That is to say, in the present exemplary embodiment, first via 103 and second via 105 are disposed in the same regions in plan view by overlapping each other over first wiring 102.

In this manner, line-shaped line vias of first via 103 and second via 105 are arranged extending in the same direction with respect to semiconductor substrate 101, and formed by embedding second wiring 104 and third wiring 106, respectively, each made of copper (Cu). If line-shaped line vias of first via 103 and second via 105 are designed such that the extending directions of first via 103 and second via 105 are the same as the direction of application of ultrasonic waves to be applied to pad structure 100 at wire-bonding, resistance to stress that is applied to pad structure 100 at wire-bonding may be increased. Accordingly, a structure which maintains connection characteristics of a wire at wire-bonding and which is strong against the stress may be achieved, and thus the structure realizes both good connection characteristics of a wire and strong stress resistance.

First Modification of Second Exemplary Embodiment

In the following, a first modification of the second exemplary embodiment is described with reference to FIGS. 16 and 17.

Figure 16:
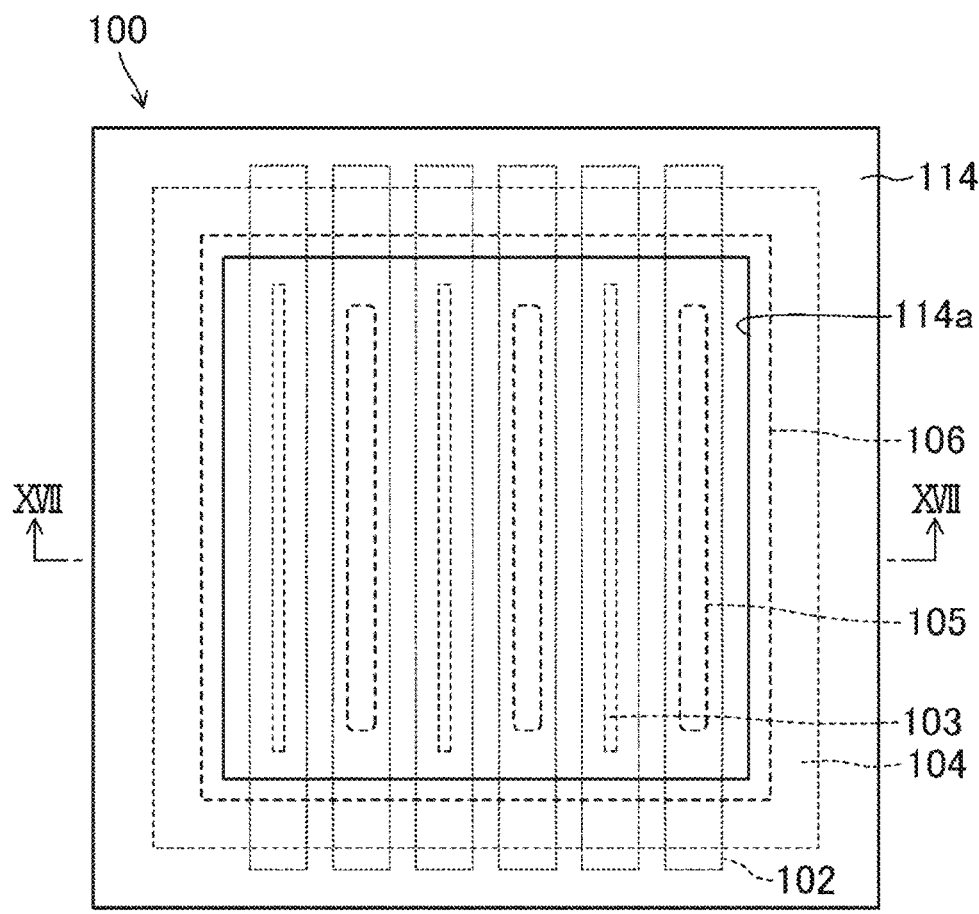
FIG. 16 is a plan view showing a pad structure which is a main portion of a semiconductor device according to a first modification of the second exemplary embodiment.
Figure 17:
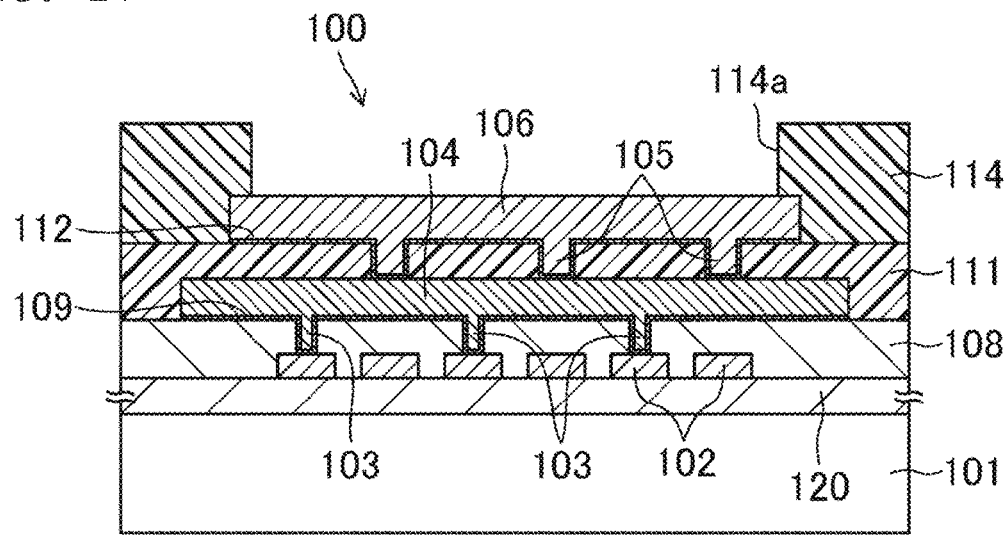
FIG. 17 is a cross-sectional view along line XVII-XVII in FIG. 16.

As shown in FIGS. 16 and 17, the present modification is different from the second exemplary embodiment in regions where second via 105 is disposed. In this modification, first via 103 and second via 105 are disposed at different regions in plan view. In other words, line-shaped line vias of first via 103 and second via 105 are alternately arranged over the plurality of line-shaped wirings of first wiring 102.

In the present modification, first via 103 and second via 105 are disposed at different regions in plan view, and second insulating film 111 made of an organic material is thus arranged over first via 103. Accordingly, in addition to the effect of the second exemplary embodiment, it is possible to achieve a structure with a greater stress relaxation effect.

Third Exemplary Embodiment

In the following, a third exemplary embodiment is described with reference to FIGS. 18 to 20.

Figure 18:
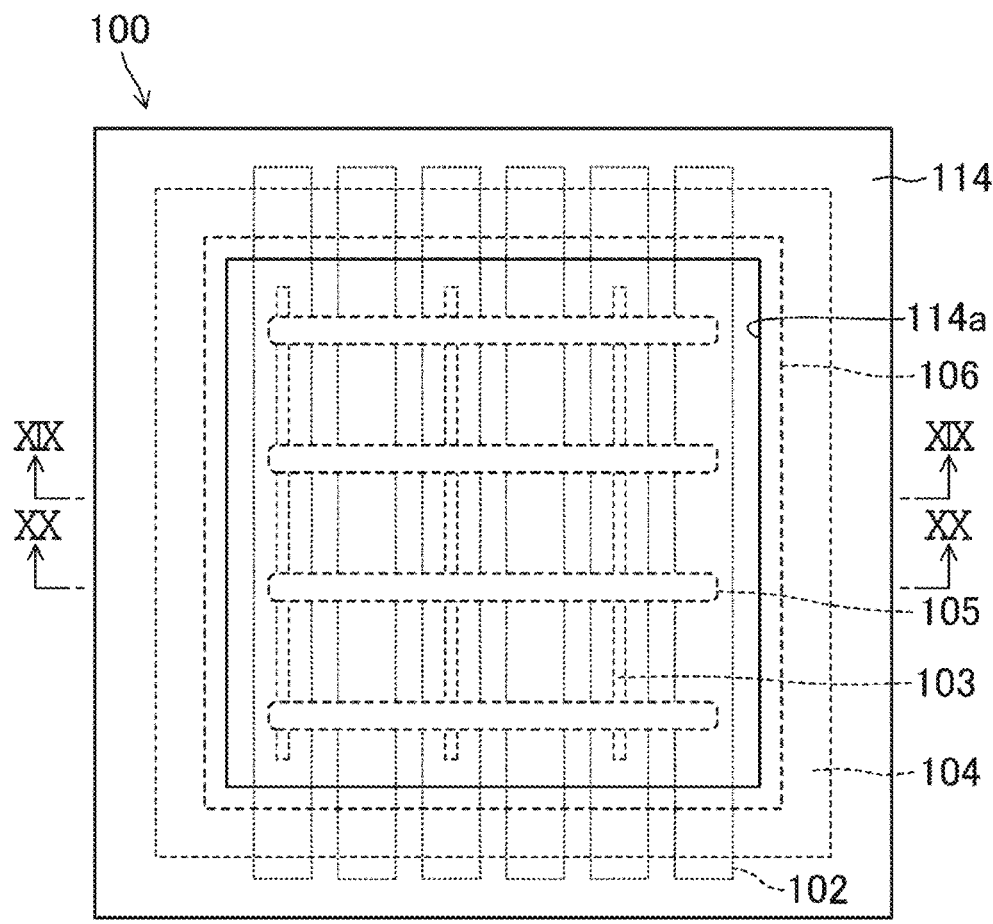
FIG. 18 is a plan view showing a pad structure which is a main portion of a semiconductor device according to a third exemplary embodiment.
Figure 19:
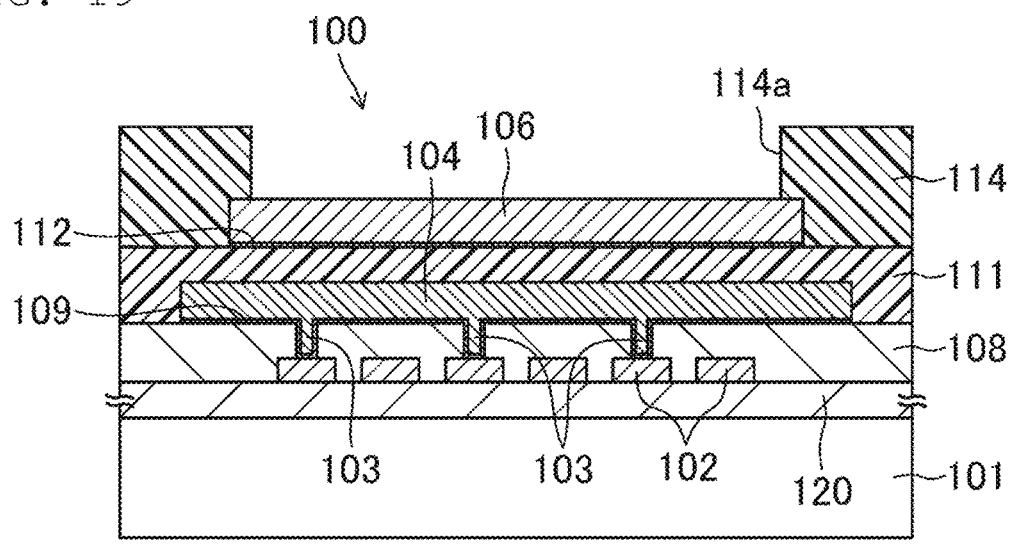
FIG. 19 is a cross-sectional view along line XIX-XIX in FIG. 18.
Figure 20:
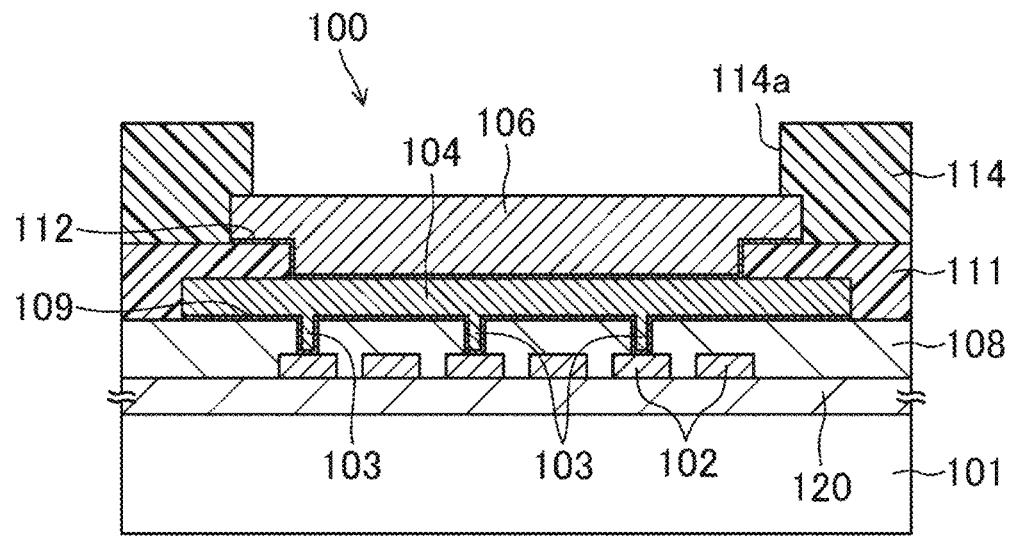
FIG. 20 is a cross-sectional view along line XX-XX in FIG. 18.

As shown in FIGS. 18 to 20, the present exemplary embodiment is different from the second exemplary embodiment in the extending direction of second via 105. In this exemplary embodiment, a plurality of line-shaped line vias of second via 105 are disposed over a plurality of line-shaped line vias of first via 103 in a direction perpendicular to the extending direction of first wiring 102. Since line-shaped line vias of first via 103 are arranged along first wiring 102, each line via of first via 103 and each line via of second via 105 intersects with each other.

As described above, in the present exemplary embodiment, first via 103 and second via 105 are arranged so as to intersect each other. According to this structure, stress applied from third wiring 106 made of copper (Cu), which is the actual pad electrode, to first insulating film 108 made of an inorganic material, which is a lower layer of third wiring 106, to a semiconductor element and the like is applied only through the intersection points of first via 103 and second via 105, and thus the effect of stress relaxation may be increased.

Fourth Exemplary Embodiment

In the following, a fourth exemplary embodiment is described with reference to FIGS. 21 and 22. Here, the vertical axis of the graph in FIG. 22 shows the relative strength.

Figure 21:
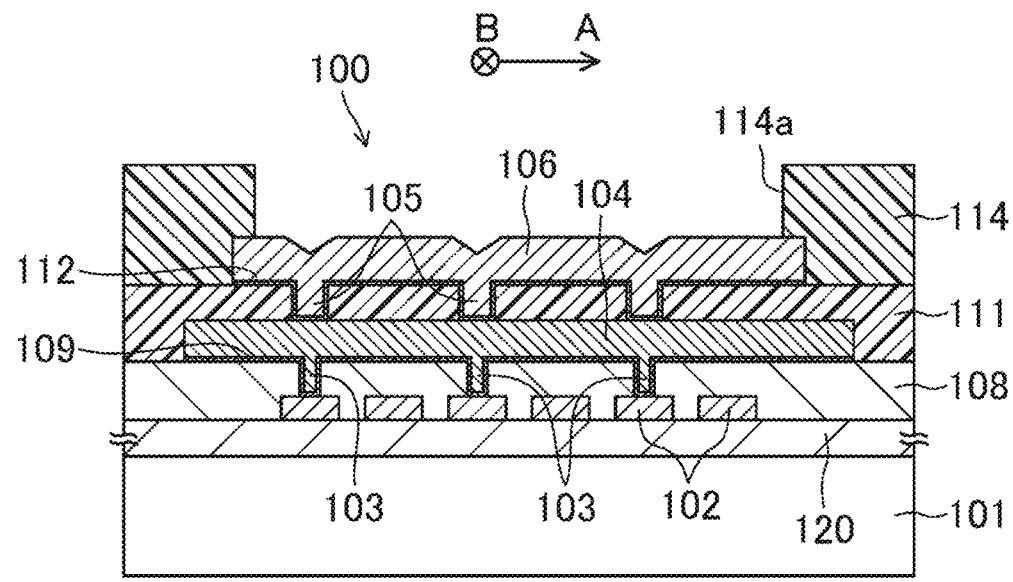
FIG. 21 is a cross-sectional view showing a pad structure which is a main portion of a semiconductor device according to a fourth exemplary embodiment.
Figure 22:
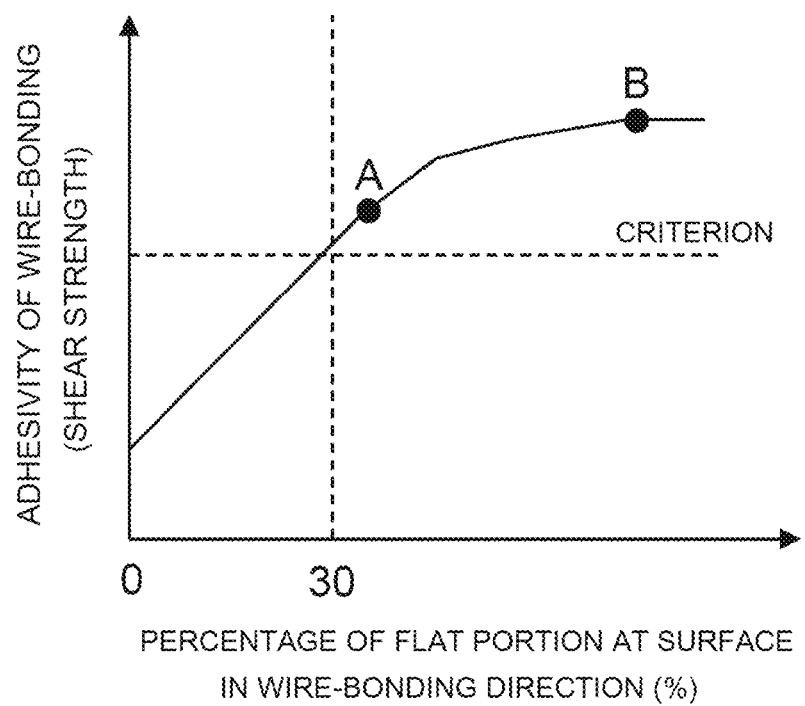
FIG. 22 is a graph showing a relationship between adhesivity of wire-bonding and a percentage of flat portion at the surface of the pad structure of the semiconductor device according to the fourth exemplary embodiment.
Figure 23:
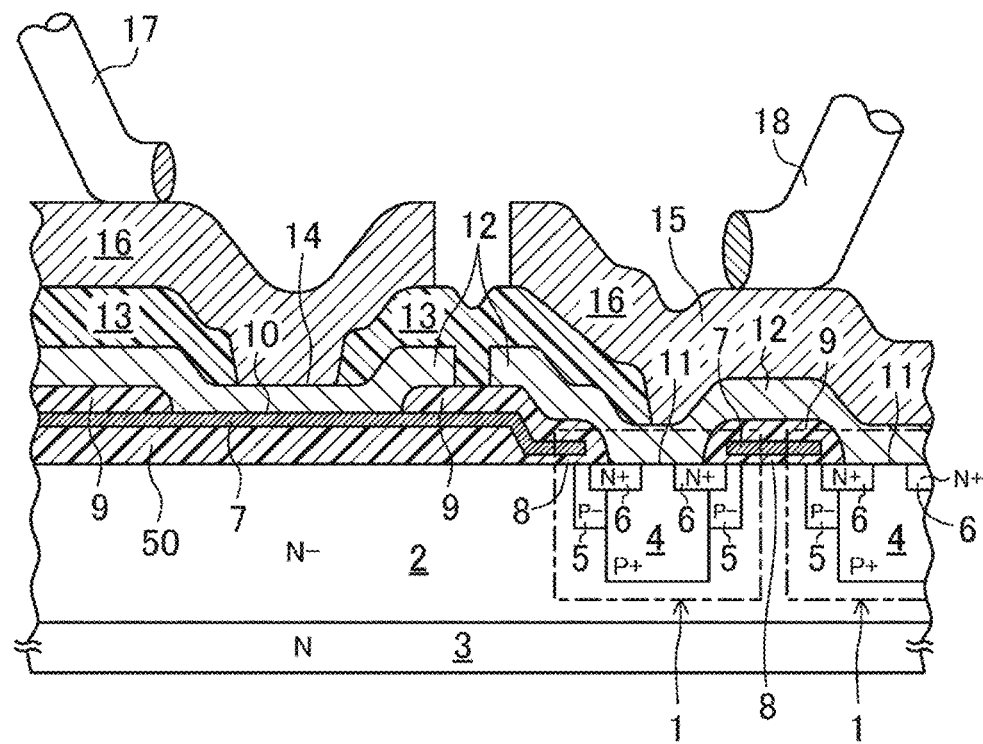
FIG. 23 is a cross-sectional view showing a semiconductor device according to a first conventional example.
Figure 24:
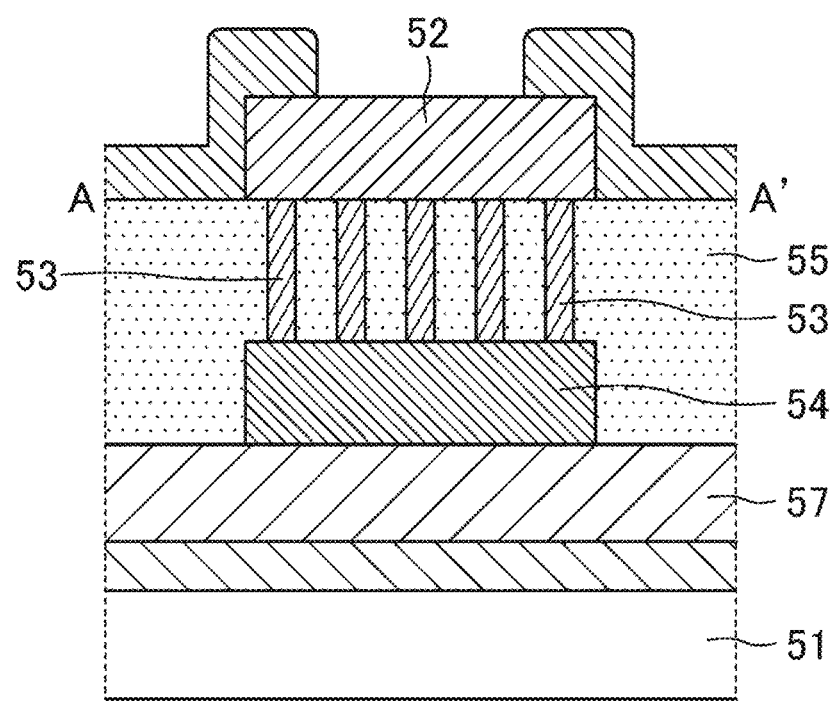
FIG. 24 is a cross-sectional view showing a pad structure which is a main portion of a semiconductor device according to a second conventional example.

As shown in FIG. 21, in the present exemplary embodiment, the embedding state of each of a plurality of line-shaped line vias of second via 105 is somewhat poor, that is to say, incomplete in contrast to the second exemplary embodiment. By making the embedding state of line-shaped line vias of second via 105 incomplete, recesses of a surface of third wiring 106, which is the actual pad electrode, are provided over line-shaped line vias of second via 105. Here, the plan view of pad structure 100 of the semiconductor device according to the present exemplary embodiment is the same as that in FIG. 14.

This may achieve a structure that the stress applied at wire-bonding on third wiring 106 is not directly transmitted to a portion under third wiring 106. Accordingly, it is possible to prevent cracking of a semiconductor element or the like formed on semiconductor substrate 101 or first insulating film 108 of an inorganic material on the semiconductor element.

Additionally, by making the direction of line-shaped recesses to match the direction of application of ultrasonic waves at wire-bonding, stress applied to first insulating film 108 or a semiconductor element or the like under may be further reduced.

That is to say, as shown in FIG. 22, if the direction of line-shaped recesses is perpendicular to the direction of application of ultrasonic waves (the direction of arrow A in FIG. 21) at wire-bonding, the adhesivity of wire-bonding might not be high. However, if the direction of line-shaped recesses is parallel to the direction of application of ultrasonic waves (the direction of B in FIG. 21) at wire-bonding, the adhesivity of wire-bonding would be high enough. Accordingly, by appropriately setting the embedding properties of second via 105 and the direction of application of ultrasonic waves at wire-bonding, a structure that the stress is further reduced and the reliability of wire-bonding is further increased may be achieved.

As described above, according to the semiconductor device of the present disclosure, cracking occurring at wire-bonding and film peeling may be prevented. Thus, by providing a pad structure of the present disclosure over a semiconductor element formed on semiconductor substrate 101, a semiconductor device where the plane size of a semiconductor substrate (a semiconductor chip) is small and the ON-resistance is suppressed may be realized.

In the present specification, four exemplary embodiments and respective modifications are described, but any possible combination of the exemplary embodiments and the modifications is able to achieve effects of stress reduction and increased reliability of wire-bonding, and is included in the present disclosure.

The semiconductor device according to the present disclosure is useful as a semiconductor device which is to be used as a high voltage device especially in a power supply circuit of a consumer appliance, for example.

What is claimed is:

1. A semiconductor device comprising:
a first wiring disposed on a semiconductor substrate;
a first insulating film disposed on the first wiring;
a first via disposed in the first insulating film so as to be connected to the first wiring;
a second wiring disposed on the first insulating film so as to be connected to the first wiring through the first via;
a first organic insulating film disposed on the second wiring;
a plurality of second vias disposed in the first organic insulating film so as to be connected to the second wiring;
a third wiring disposed on the first organic insulating film so as to be connected to the second wiring through the plurality of second vias; and
a second organic insulating film disposed on the first organic insulating film,
wherein:
the first organic insulating film is the only insulating film disposed between the second wiring and the third wiring, the first organic insulating film being a single layer film, the first organic insulating film entirely filling an insulating region formed between the second wiring and the third wiring,
a pad opening portion through which the third wiring is exposed is provided in the second organic insulating film,
the third wiring covers an entire area exposed from the pad opening portion, and
the first via, the plurality of second vias, the second wiring, and the third wiring are made of metal whose main component is copper.

2. The semiconductor device according to claim 1, wherein a seed layer is disposed at a boundary portion between the second wiring and the first insulating film, and at a boundary portion between the third wiring and the first organic insulating film.

3. The semiconductor device according to claim 2, wherein the seed layer is not disposed at either a connection portion between the first via and the second wiring, or connection portions between the plurality of second vias and the third wiring.

4. The semiconductor device according to claim 1, wherein a barrier film is disposed on at least one of the second wiring and the third wiring.

5. The semiconductor device according to claim 1, wherein a recess of an upper surface of the third wiring is provided over at least one of the plurality of second vias.

6. The semiconductor device according to claim 1, wherein:
the first wiring is configured by one of a plurality of line-shaped wirings which are arranged in parallel with each other, and is disposed under the pad opening portion, and
the first via is configured by one of a plurality of line-shaped line vias which are arranged along and on the first wiring in plan view.

7. The semiconductor device according to claim 6, wherein the line vias are arranged on every other line-shaped wirings of the first wiring in plan view.

8. The semiconductor device according to claim 6, wherein each of the plurality of second vias is configured by a line-shaped line via.

9. The semiconductor device according to claim 8, wherein the first via and at least one of the plurality of second vias are arranged in parallel with each other in plan view.

10. The semiconductor device according to claim 8, wherein the first via and at least one of the plurality of second vias are arranged so as to overlap each other in plan view.

11. The semiconductor device according to claim 6, wherein each of the plurality of second vias is configured by a dot via which is disposed in an island manner.

12. The semiconductor device according to claim 11, wherein at least one of the plurality of second vias is disposed so as to overlap the first via in plan view.

13. The semiconductor device according to claim 12, wherein the plurality of second vias are configured by a plurality of dot vias which are arranged at an interval over the first via, and another plurality of dot vias which are arranged at an interval in a direction intersecting an extending direction of the first via.

14. The semiconductor device according to claim 13, wherein the plurality of the second vias are arranged at positions other than an intersection point of a first virtual line and a second virtual line, the first virtual line is passing through the first wiring where the first via is not disposed, and the second virtual is intersecting with the first virtual line and passing through at least one of the plurality of second vias disposed above the first wiring where the first via is disposed.

15. The semiconductor device according to claim 1, wherein:
the first wiring is configured by one of a plurality of line-shaped wirings which are arranged in parallel with each other, and is disposed under the pad opening portion, the first via is one of a plurality of first dot vias disposed on the first wiring in an island manner, and the plurality of second vias are configured by a plurality of second dot vias disposed above the first wiring in an island manner, the plurality of first dot vias and the plurality of second dot vias are arranged so as not to overlap each other in plan view, the plurality of the first dot vias are arranged on every other line-shaped wirings of the first wiring, and the plurality of the second dot vias are arranged at positions other than an intersection point of a first virtual line and a second virtual line, the first virtual line is passing through the first wiring where at least one of the plurality of the first dot vias is not disposed, and the second virtual line is intersecting with the first virtual line and passing through at least one of the plurality of the second vias disposed above the first wiring where at least one of the plurality of the first dot vias is disposed.

16. The semiconductor device according to claim 1, wherein:

the first wiring is configured by one of a plurality of line-shaped wirings which are arranged in parallel with each other, and is disposed under the pad opening portion, the second wiring is configured by one of a plurality of line-shaped wirings which are arranged along a direction intersecting with an extending direction of the first wiring in plan view, and the first via is configured by a dot via disposed in an island manner, and disposed in a region where the first wiring and the second wiring overlap each other in plan view.

17. The semiconductor device according to claim 16, wherein each of the plurality of second vias is configured by a dot via disposed in an island manner, and disposed in a region where the first wiring and the second wiring overlap each other in plan view and where the first via is not disposed.

18. The semiconductor device according to claim 1, wherein:

a semiconductor element is disposed on the semiconductor substrate, and the pad opening portion of the second organic insulating film is provided over the semiconductor element.

* * * * *